[19] US012519477B2

United States Patent
Gong et al.

(10) Patent No.: US 12,519,477 B2
(45) Date of Patent: Jan. 6, 2026

(54) METHOD AND AN APPARATUS FOR GENERATING AN OUTPUT CLOCK IN A MULTI-LOOP PLL SYSTEM

(71) Applicant: Skyworks Solutions, Inc., Irvine, CA (US)

(72) Inventors: Xue-Mei Gong, Austin, TX (US); James David Barnette, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 44 days.

(21) Appl. No.: 18/592,298

(22) Filed: Feb. 29, 2024

(65) Prior Publication Data

US 2024/0297656 A1 Sep. 5, 2024

Related U.S. Application Data

(60) Provisional application No. 63/449,497, filed on Mar. 2, 2023.

(51) Int. Cl.
*H03L 7/099* (2006.01)
*H03L 7/195* (2006.01)

(52) U.S. Cl.
CPC ............ *H03L 7/0992* (2013.01); *H03L 7/195* (2013.01)

(58) Field of Classification Search
CPC .............................. H03L 7/0992; H03L 7/195
See application file for complete search history.

(56) References Cited

U.S. PATENT DOCUMENTS

| | | |
|---|---|---|
| 6,114,888 A | 9/2000 | Walley |
| 6,147,561 A | 11/2000 | Rhee et al. |
| 6,281,758 B1 | 8/2001 | Elsayed et al. |
| 6,404,291 B1 | 6/2002 | Riley |
| 6,411,820 B1 | 6/2002 | Margarit et al. |
| 6,466,069 B1 | 10/2002 | Rozenblit et al. |
| 6,580,376 B2 | 6/2003 | Perrott |
| 6,590,426 B2 | 7/2003 | Perrott |
| 6,611,160 B1 | 8/2003 | Lee et al. |
| 6,630,868 B2 | 10/2003 | Perrott et al. |
| 6,686,803 B1 | 2/2004 | Perrott et al. |
| 6,707,342 B1 | 3/2004 | Zachan et al. |
| 6,717,475 B2 | 4/2004 | Mccarthy |
| 6,766,178 B1 | 7/2004 | Damgaard et al. |
| 6,785,346 B1 | 8/2004 | Birkett et al. |
| 6,831,523 B1 | 12/2004 | Pastorello et al. |
| 6,862,313 B2 | 3/2005 | Walley et al. |

(Continued)

*Primary Examiner* — Freshteh N Aghdam
(74) *Attorney, Agent, or Firm* — Knobbe, Martens, Olson & Bear, LLP

(57) ABSTRACT

A multi-loop clock signal generator includes a first phase-locked loop circuit configured to generate a control signal and a voltage-controlled oscillator configured to generate an output clock signal based on the control signal. The clock signal generator includes a second phase-locked loop circuit configured to generate an adjusted first divider value for the first phase-locked loop circuit. The clock signal generator further includes a target frequency calculation circuit configured to calculate a target frequency for the second phase-locked loop circuit based on a target frequency ratio of the second phase-locked loop circuit calculated based on frequency offset ratios of the first and second clock signals with respect to a reference signal.

18 Claims, 9 Drawing Sheets

(56) References Cited

U.S. PATENT DOCUMENTS

| | | | |
|---|---|---|---|
| 6,920,622 | B1 | 7/2005 | Garlepp et al. |
| 6,970,030 | B1 * | 11/2005 | Huang .................... H03L 7/183 |
| | | | 327/296 |
| 7,084,709 | B1 | 8/2006 | Leong et al. |
| 7,138,839 | B2 | 11/2006 | Zachan et al. |
| 7,180,377 | B1 | 2/2007 | Leong et al. |
| 7,236,024 | B2 | 6/2007 | Huang et al. |
| 7,288,998 | B2 | 10/2007 | Thomsen et al. |
| 7,295,077 | B2 | 11/2007 | Thomsen et al. |
| 7,436,227 | B2 | 10/2008 | Thomsen et al. |
| 7,443,250 | B2 | 10/2008 | Seethamraju et al. |
| 7,576,614 | B2 | 8/2009 | Zachan et al. |
| 7,612,617 | B2 | 11/2009 | Pullela et al. |
| 7,613,267 | B2 | 11/2009 | Perrott et al. |
| 8,154,351 | B2 | 4/2012 | Tadjpour |
| 8,228,431 | B2 | 7/2012 | Gao et al. |
| 8,242,849 | B1 | 8/2012 | Seethamraju et al. |
| 8,441,291 | B2 | 5/2013 | Hara et al. |
| 8,456,206 | B2 | 6/2013 | Namdar-mehdiabadi et al. |
| 8,532,243 | B2 | 9/2013 | Seethamraju et al. |
| 8,554,156 | B2 | 10/2013 | Tadjpour |
| 8,786,341 | B1 | 7/2014 | Weltin-Wu et al. |
| 8,791,734 | B1 * | 7/2014 | Hara ....................... H03L 7/146 |
| | | | 327/158 |
| 8,989,332 | B2 | 3/2015 | Katumba et al. |
| 8,994,420 | B2 | 3/2015 | Eldredge et al. |
| 9,036,762 | B2 | 5/2015 | Green |
| 9,065,457 | B2 | 6/2015 | Namdar-mehdiabadi et al. |
| 9,246,500 | B2 | 1/2016 | Perrott et al. |
| 9,270,288 | B2 | 2/2016 | Perrott |
| 9,461,653 | B2 | 10/2016 | Perrott |
| 9,490,818 | B2 | 11/2016 | Perrott |
| 9,531,392 | B2 | 12/2016 | Katumba et al. |
| 9,762,250 | B2 | 9/2017 | Perrott |
| 10,075,173 | B2 | 9/2018 | Sarda |
| 10,608,647 | B1 * | 3/2020 | Ranganathan .......... H03L 7/085 |
| 10,608,649 | B1 | 3/2020 | Jayakumar et al. |
| 10,651,862 | B1 | 5/2020 | Barnette et al. |
| 10,727,844 | B1 | 7/2020 | Gong et al. |
| 10,727,845 | B1 | 7/2020 | Balakrishnan et al. |
| 10,819,353 | B1 | 10/2020 | Monk et al. |
| 10,819,354 | B2 | 10/2020 | Jayakumar et al. |
| 10,826,507 | B1 | 11/2020 | Gong et al. |
| 11,018,679 | B1 | 5/2021 | Jayakumar et al. |
| 11,088,816 | B1 | 8/2021 | Sarda |
| 11,290,250 | B2 | 3/2022 | Sarda |
| 11,526,135 | B2 | 12/2022 | Balakrishnan et al. |
| 2006/0267644 | A1 | 11/2006 | Youssoufian et al. |
| 2007/0146083 | A1 | 6/2007 | Hein et al. |
| 2008/0061888 | A1 * | 3/2008 | Liu ........................... H03L 7/23 |
| | | | 331/11 |
| 2010/0283549 | A1 * | 11/2010 | Wang .................... H03L 7/1976 |
| | | | 331/34 |
| 2015/0295582 | A1 * | 10/2015 | El Moznine ............ H03L 7/107 |
| | | | 375/376 |
| 2023/0223944 | A1 | 7/2023 | Rafi et al. |
| 2023/0379132 | A1 | 11/2023 | Sarda |
| 2024/0297656 | A1 | 9/2024 | Gong et al. |

\* cited by examiner

METHOD AND AN APPARATUS FOR GENERATING AN OUTPUT CLOCK IN A MULTI-LOOP PLL SYSTEM

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

This invention relates to integrated circuits and more particularly to clock generator integrated circuits.

Description of the Related Technology

High speed communication systems require high speed clock signals for transmission and reception of information. A typical clock generation circuit includes a phase-locked loop (PLL) that receives a synchronization reference clock signal and generates one or more high speed clock signals suitable for use in transmitting or receiving data. FIG. 1 illustrates a functional block diagram of a conventional analog phase-locked loop including fractional dividers for generating a reference clock signal and a feedback clock signal at target frequencies. Phase-locked loop 10 includes phase/frequency detector 12, which receives reference clock signal REFCLK from fractional frequency divider 11, loop filter 14, and voltage-controlled oscillator 16. Fractional frequency divider 11 and fractional frequency divider 18 divide input clock signal CLKIN and output clock signal CLKOUT, respectively, to generate reference clock signal REFCLK and feedback clocks signal FBCLK at target frequencies.

Fractional frequency divider circuits 11 and 18 use conventional techniques that introduce jitter into the resulting frequency-divided signals, reference clock signal REFCLK and feedback clock signal FBCLK, respectively. As clock signal frequencies increase, the level of jitter that is acceptable in output clock signals decreases. Conventional fractional frequency dividers introduce quantization noise into the input reference clock signal or feedback clock signal and require that the phase-locked loop have a low bandwidth to filter out quantization noise. In general, phase error correction techniques used to address jitter are complex, may introduce spurs into the frequency-divided clock signal, and are expensive. In addition, use of conventional fractional frequency dividers for generating input reference clock signal REFCLK and feedback clock signal FBCLK in a phase-locked loop requires that phase frequency detector 12 support a large full-scale phase range.

SUMMARY

In some aspects, the techniques described herein relate to a multi-loop clock signal generator including: a first phase-locked loop circuit configured to generate a control signal based on a first clock signal and a first divider value; a voltage-controlled oscillator configured to generate an output clock signal based on the control signal provided by the first phase-locked loop circuit; a second phase-locked loop circuit configured to generate an adjusted first divider value for the first phase-locked loop circuit according to a target frequency of the second phase-locked loop circuit based on a second clock signal and a second divider value; and a target frequency calculation circuit configured to calculate the target frequency for the second phase-locked loop circuit based on a target frequency ratio that is independent from the output clock signal generated by the voltage-controlled oscillator and that is calculated based on a frequency offset ratio of the first clock signal with respect to a reference signal measured at a first time interval and a frequency offset ratio of the second clock signal with respect to the reference signal measured at a second time interval after the first phase-locked loop circuit is closed.

In some aspects, the techniques described herein relate to a multi-loop clock signal generator wherein calculation of the target frequency is performed while the output clock signal of the voltage-controlled oscillator is still settling, after the first phase-locked loop circuit is closed.

In some aspects, the techniques described herein relate to a multi-loop clock signal generator wherein each of the first clock signal and the second clock signal is generated by at least one of crystal oscillator (XO), temperature compensated crystal oscillator (TCXO) and oven controlled crystal oscillator (OCXO).

In some aspects, the techniques described herein relate to a multi-loop clock signal generator wherein calculation of the target frequency includes scaling the second clock signal in frequency based on a scaling value.

In some aspects, the techniques described herein relate to a multi-loop clock signal generator wherein the frequency offset ratio for the second clock signal is defined by:

$$1 - \frac{\text{(measured second input clock signal)} \times \text{(scaling value)}}{\text{(measured OOF\_refclk)}}.$$

In some aspects, the techniques described herein relate to a multi-loop clock signal generator wherein the target frequency is calculated based on the target frequency ratio, defined by:

$$\frac{(\text{Div}\_1)}{(\text{Div}\_1\prime)} \times \frac{(\text{Div}\_2\prime)}{(\text{Div}\_2)} \times \frac{(1 - \text{frequency offset ratio\_first clock signal})}{(1 - \text{frequency offset ratio\_second clock signal})},$$

with Div_1 being the first divider value, Div_1' being the adjusted first divider value, Div_2 being the second divider value, Div_2' being an adjusted second divider value, if exists (if not, equals to Div_2), frequency offset ratio_first clock signal being a frequency offset ratio for the first clock signal at a first interval of time, an frequency offset ratio_ second clock signal being a frequency offset ratio for the second clock signal at a second interval of time.

In some aspects, the techniques described herein relate to a multi-loop clock signal generator wherein the target frequency is defined by:

$$\text{Target frequency} = (\text{target frequency ratio} - 1) * \text{Div}\_1'.$$

In some aspects, the techniques described herein relate to a multi-loop clock signal generator further including: a third phase-locked loop circuit configured to generate an adjusted second divider value according to a target frequency of the third phase-locked loop circuit based on at least one third clock signal and a third divider value, the target frequency calculation circuit being configured to calculate a target frequency for the third phase-locked loop circuit based on a target frequency ratio of the third phase-locked loop circuit that is independent from the output clock signal generated by the voltage-controlled oscillator, the target frequency ratio calculated based on a frequency offset ratio of the second clock signal with respect to the reference signal measured at second time interval and a frequency offset ratio of the at least one third clock signal with respect to the reference signal measured at a third time interval after the second phase-locked loop circuit is closed.

In some aspects, the techniques described herein relate to a multi-loop clock signal generator wherein calculation of the target frequency of the third phase-locked loop circuit is performed while the output clock signal of the voltage-controlled oscillator is settling, after the second phase-locked loop circuit is closed.

In some aspects, the techniques described herein relate to a method for generating an output clock signal using multi-loop clock signal generator, the method including: generating, by a first phase-locked loop circuit, a control signal based on a first clock signal and a first divider value; generating, by a voltage-controlled oscillator, an output clock signal based on the control signal; calculating, by a target frequency calculation circuit, a target frequency ratio of a second phase-locked loop circuit based on a frequency offset ratio of the first clock signal with respect to a reference signal measured at a first time interval and a frequency offset ratio of a second clock signal with respect to the reference signal measured at a second time interval after the first phase-locked loop circuit is closed; calculating, by the target frequency calculation circuit, a target frequency based on the target frequency ratio, the target frequency independent from the output clock signal generated by the voltage-controlled oscillator; and generating, by the second phase-locked loop circuit, an adjusted first divider value for the first phase-locked loop circuit according to the target frequency based on the second clock signal and a second divider value.

In some aspects, the techniques described herein relate to a method wherein calculating the target frequency is performed while the output clock signal of the voltage-controlled oscillator is still settling.

In some aspects, the techniques described herein relate to a method wherein each of the first clock signal and the second clock signal is generated by at least one of crystal oscillator (XO), temperature compensated crystal oscillator (TCXO) and oven controlled crystal oscillator (OCXO).

In some aspects, the techniques described herein relate to a method wherein calculating the target frequency includes scaling the second clock signal in frequency based on a scaling value.

In some aspects, the techniques described herein relate to a method wherein the frequency offset ratio for the second clock signal is defined by:

$$1 - \frac{\text{(measured second input clock signal)} \times \text{(scaling value)}}{\text{(measured OOF\_refclk)}}.$$

In some aspects, the techniques described herein relate to a method wherein the target frequency is calculated based on the target frequency ratio, defined by:

$$\frac{(\text{Div\_1})}{(\text{Div\_1'})} \times \frac{(\text{Div\_2'})}{(\text{Div\_2})} \times \frac{(1 - \text{frequency } \textit{offser} \text{ ratio\_first clock signal})}{(1 - \text{frequency offset ratio\_second clock signal})},$$

with Div_1 being the first divider value, Div_1' being the adjusted first divider value, Div_2 being the second divider value, Div_2' being an adjusted second divider value if exists, (if not, equals to Div_2), frequency offset ratio_first clock signal being a frequency offset ratio for the first clock signal at a first interval of time, and frequency offset ratio_second clock signal being a frequency offset ratio for the second clock signal at a second interval of time.

In some aspects, the techniques described herein relate to a method wherein the target frequency is defined by:

$$\text{target frequency} = (\text{target frequency ratio} - 1) * \text{Div\_1'}.$$

In some aspects, the techniques described herein relate to a method further including: calculating, by the target frequency calculation circuit, a target frequency ratio based on a frequency offset ratio of the second clock signal with respect to a reference signal measured at the second time interval and a frequency offset ratio of a third clock signal with respect to the reference signal measured at a third time interval after the second phase-locked loop circuit is closed; calculating, by the target frequency calculation circuit, a target frequency for a third phase-locked loop circuit based on the target frequency ratio of the third phase-locked loop circuit that is independent from the output clock signal generated by the voltage-controlled oscillator; and generating, by the third phase-locked loop circuit, an adjusted second divider value for the second phase-locked loop circuit according to the target frequency of the third phase-locked loop circuit based on the third clock signal and a third divider value.

In some aspects, the techniques described herein relate to a method wherein calculation of the target frequency of the third phase-locked loop circuit is performed while the output clock signal of the voltage-controlled oscillator is settling, after the second phase-locked loop circuit is closed.

DETAILED DESCRIPTION OF EMBODIMENTS

Figure 1:
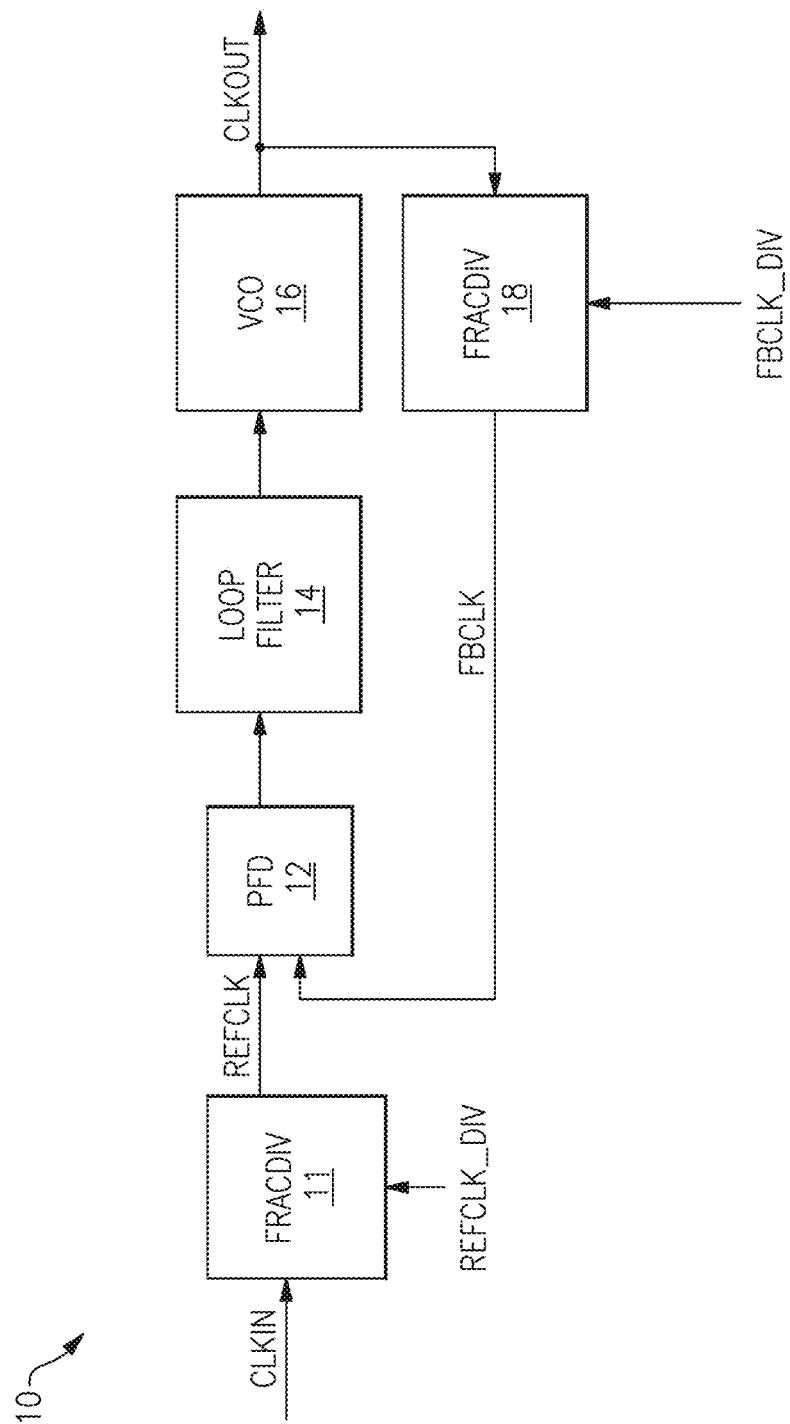
FIG. 1 illustrates a functional block diagram of a conventional analog phase-locked loop including fractional dividers for generating the reference clock signal and the feedback clock signal.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 2:
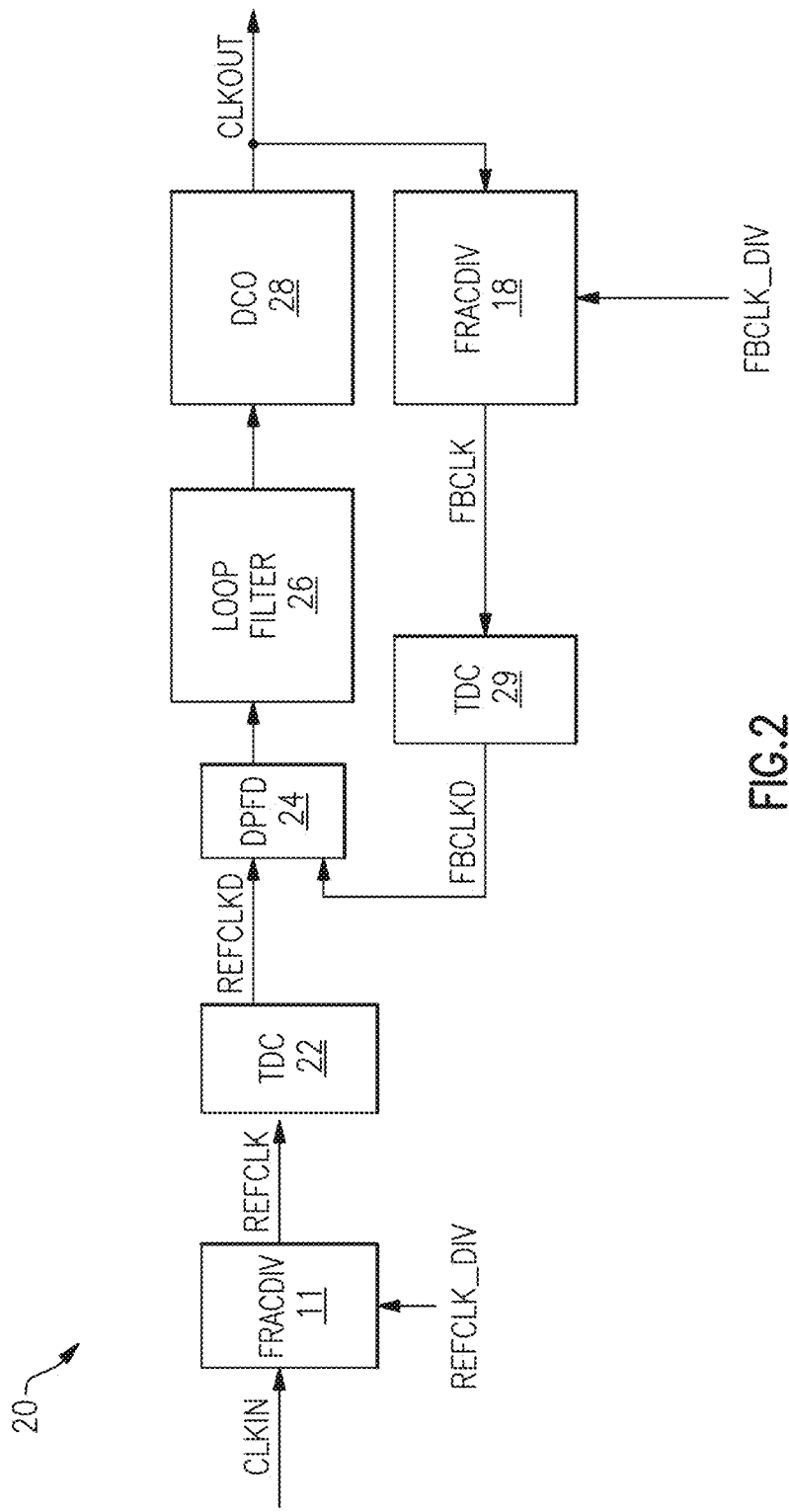
FIG. 2 illustrates a functional block diagram of an exemplary phase-locked loop including a digital phase/frequency detector and conventional fractional frequency dividers for generating the reference clock signal and the feedback clock signal.

Recent improvements to resolution and accuracy of time-to-digital converters facilitate the use of digital phase/frequency detectors in a phase-locked loop for clock generation applications. In general, digital phase/frequency detectors are more flexible and less expensive than analog phase/frequency detectors. FIG. 2 illustrates a functional block diagram of an exemplary phase-locked loop including digital phase/frequency detector 24, digital loop filter 26, digitally-controlled oscillator 28, and conventional fractional frequency dividers 11 and 18, which generate reference clock signal REFCLK and feedback clock signal FBCLK. In at least one embodiment, time-to-digital converters 22 and 29 generate digital reference clock signal REFCLKD and digital feedback clock signal FBCLKD according to divider code REFCLK DIV and divider code FBCLK DIV, respectively. Although digital phase/frequency detector 24 is capable of supporting a wide range of full-scale signals, conventional fractional frequency divider circuits 11 and 18 require phase-locked loop 20 to have a low bandwidth to filter out quantization noise introduced into digital reference clock signal REFCLKD and digital feedback clock signal FBCLKD. However, lower bandwidths are associated with increased accumulated phase error.

Figure 3:
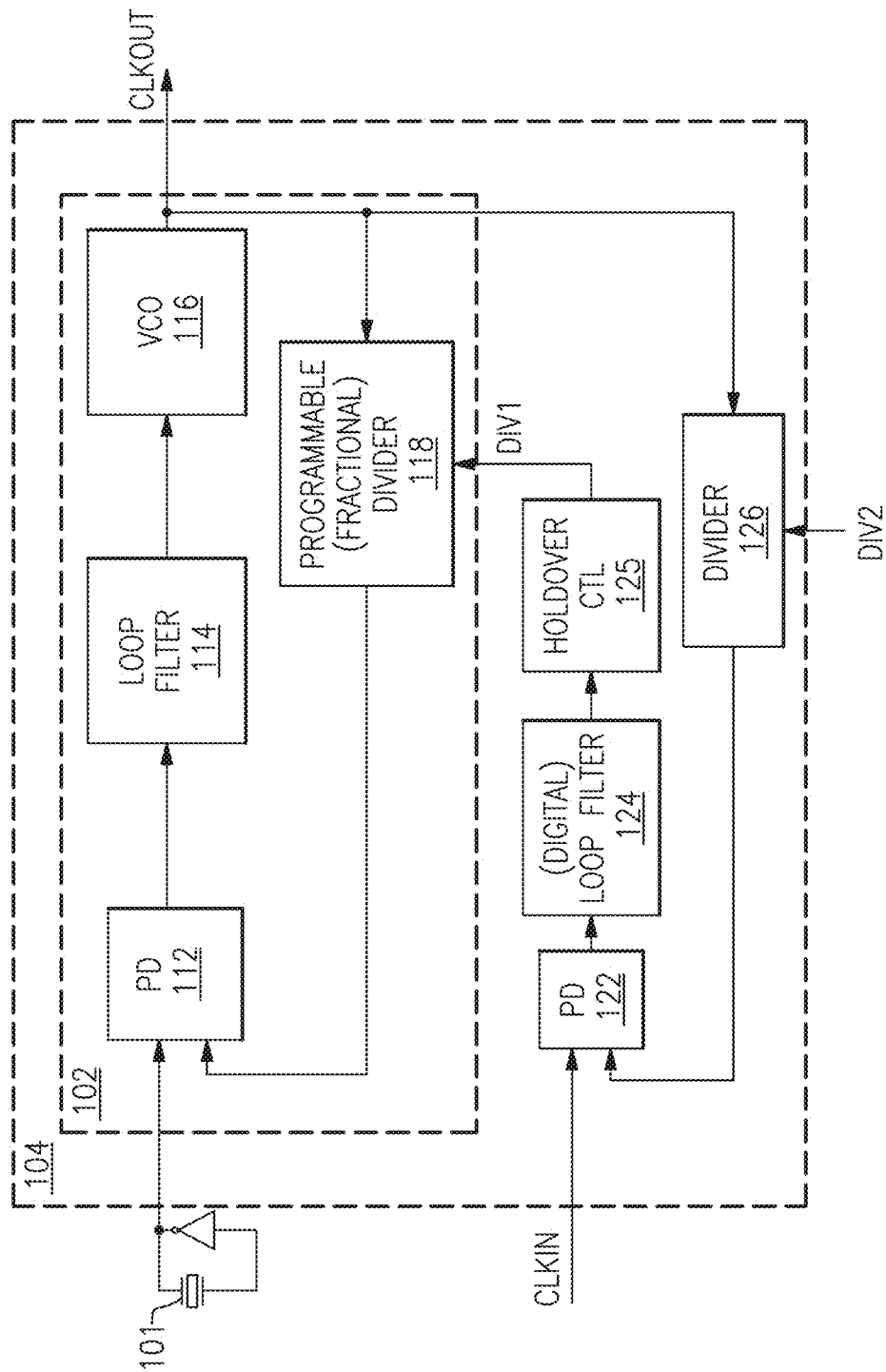
FIG. 3 illustrates a functional block diagram of an exemplary low-jitter clock generation circuit.

FIG. 3 illustrates a functional block diagram of an exemplary low-jitter clock generation circuit.

Referring to FIG. 3, in an exemplary clock generator including, a multi-loop phase-locked loop (PLL) that generates an output clock signal, CLKOUT, having low jitter by locking an input clock signal, CLKIN, to reference clock source 101. Inner loop 102, is a first PLL that includes phase/frequency detector 112, loop filter 114, and voltage-controlled oscillator 116. Voltage controlled oscillator 116 may be implemented as a ring oscillator, an LC oscillator, or other suitable oscillator structure. Phase/frequency detector 112 receives a clock signal from reference clock source 101, which can be provided by a fixed source such as a crystal oscillator, a microelectromechanical structure (MEMS) oscillator, or other suitable low-jitter source. Outer loop 104 is another PLL that includes phase/frequency detector 122, loop filter 124, and uses inner loop 102 as a digitally controlled oscillator (DCO) responsive to a digital divider ratio, DIV1, which may be a fractional divider value provided by loop filter 124. A typical DCO includes a typical voltage controlled oscillator (e.g., a harmonic oscillator or relaxation oscillator that may include an LC circuit) driven by a control signal from a digital-to-analog converter. Phase/frequency detector 122 receives CLKIN and a feedback signal, which may be a frequency-divided version of CLKOUT. Phase/frequency detector 122 provides a phase error signal reflecting the difference between CLKIN and the feedback signal. The frequency of CLKOUT is determined by the frequency of reference clock source 101 and the divider ratio generated by outer loop 104 and provided to divider 118 in the feedback path of inner loop 102. Outer loop 104 adjusts the divider ratio to match the frequency of CLKOUT to the frequency of CLKIN or to an integer multiple (DIV2) of the frequency of CLKIN (e.g., CLKIN=CLKOUT/DIV2).

When holdover controller 125 detects a holdover condition, that is, when reference clock signal CLKIN is invalid, which may be indicated by a loss of signal condition indicator or an out-of-frequency condition indicator, holdover controller 125 "freezes" loop filter 124 of PLL 104 such that the divider ratio provided to divider 118, DIV1, no longer tracks changes to CLKIN, and selects a held output of the loop filter 124, or a value based on a held output of loop filter 124, to be provided to divider 118, thereby holding steady the frequency of CLKOUT. For example, holdover control 125 of outer loop 104 holds the output of loop filter 124 to a value corresponding to a value of CLKIN received prior to entering the holdover mode so that no updating of DIV1 occurs. In at least one embodiment of the clock generator, during holdover mode, feedback divider ratio provided by the outer loop to divider 118 is based on past divider values (e.g., is an average of past divider values). Techniques for generating a clock signal in a holdover mode are described in U.S. patent application Ser. No. 10/453,990, filed Jun. 4, 2003, entitled "Method and Apparatus for Generating a Clock Signal in Holdover Mode," naming Bruno W. Garlepp and Gerard Pepenella as inventors, now U.S. Pat. No. 7,148,753, and in U.S. patent application Ser. No. 11/673,819, filed Feb. 12, 2007, entitled "Digital Hold in a Phase-Locked Loop," naming Srisai R. Seethamraju, Jerrell P. Hein, Kenneth Kin Wai Wong, and Qicheng Yu as inventors, which applications are incorporated by reference herein. When the divide ratio is frozen, the output frequency of CLKOUT varies only based on frequency variation of the reference clock source 101. A typical reference clock source 101 is a relatively low-cost clock source having a jitter performance that satisfies jitter specifications for a target application. Such typical reference clock sources generate signals having a frequency that is highly dependent on temperature (e.g., approximately 15 parts-per-million (ppm)). Such poor temperature stability of reference clock source 101 results in CLKOUT having low-frequency drift after a loss of the input clock signal, CLKIN. That low-frequency drift may be unacceptable for a target application.

Figure 4:
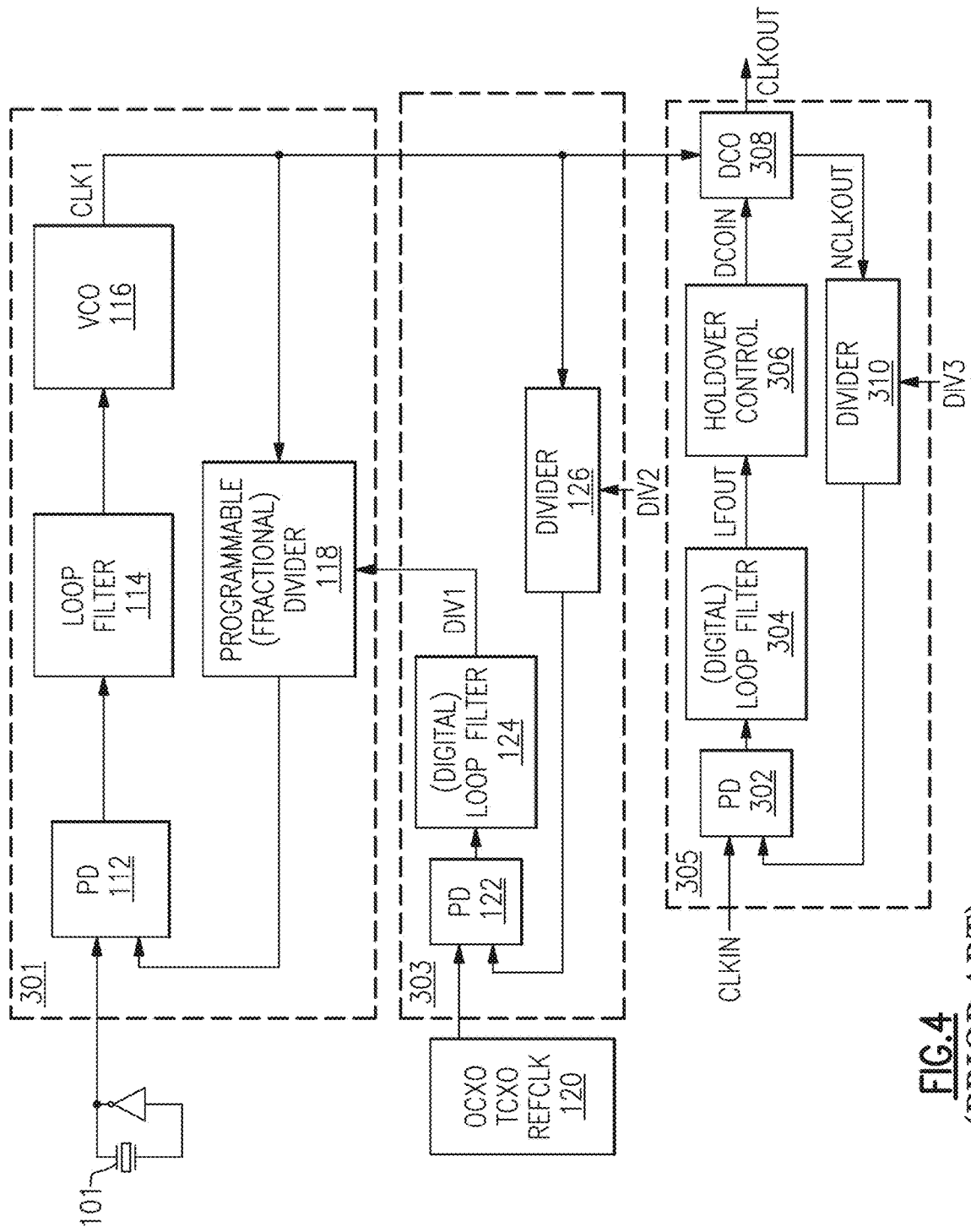
FIG. 4 illustrates a functional block diagram of a cascaded PLL clock generation circuit consistent.

FIG. 4 illustrates a functional block diagram of a cascaded PLL clock generation circuit consistent.

Referring to FIG. 4, a clock generation technique reduces frequency drift of a low-jitter clock signal in a holdover mode. In at least one embodiment, a clock generator includes multiple cascaded PLLs to lock a frequency stable, low-jitter clock signal to an input clock signal to generate an output clock signal in a normal mode (i.e., in response to detection of a valid input clock signal). In a holdover mode (i.e., in the absence of a valid input clock signal), the multiple cascaded PLLs provide a frequency stable, low-jitter clock signal using a control value based on one or more past control values. An inner loop PLL, PLL 301, generates a frequency-stable, low-jitter clock signal, CLK1, based on a low-jitter reference clock signal provided by clock source 101, e.g., a crystal, and a divider value, DIV1. The divider value, DIV1, which may be an integer divider value or a fractional divider value, is dynamically updated and provided to PLL 301 by an outer loop PLL, PLL 303. Phase-locked loop 303 generates the dynamically updated divider value based on CLK1, a predetermined divider value, DIV2, and a temperature-stable reference signal provided by reference clock 120, which may be an OCXO, a TCXO, or other suitable temperature-stable reference clock. Note that temperature-stable reference clock source 120 need not provide a low-jitter reference signal. Phase-locked loop 303 locks DIV1 to a divider value that locks CLK1 to the signal generated by frequency-stable reference clock 120. Predetermined divider value DIV2 may be provided to divider 126 by a storage device and/or provided by a terminal of an integrated circuit including the clock generator. The value of DIV2 is based on a ratio of the frequency of frequency-stable reference clock source 120 and a target frequency of CLK1. Divider value DIV2 may be an integer or a fractional divider value and divider 126 may be any suitable integer or fractional frequency-dividing circuit.

Still referring to FIG. 4, another outer-loop PLL, PLL 305, locks the output clock signal, CLKOUT, to an input clock signal, CLKIN, when the input clock signal is valid. Phase-locked loop 305 includes holdover functionality and generates a low-jitter, frequency-stable clock signal in the absence of a valid CLKIN signal. For example, when in the normal mode of operation, PLL 305 locks to CLKIN and holdover control 306 provides the updated output value of loop filter 304 to DCO 308. Thus, when CLKIN is valid, DCO 308 is controlled by the output of loop filter 304. Meanwhile, holdover controller 306 stores at least one value based on the output value of loop filter 304 in a holdover storage element. When in a holdover mode (e.g., CLKIN is invalid), holdover controller 306 provides to DCO 308 a control value based on a frozen value of the output of loop filter 304 from the holdover storage element, and DCO 308 no longer tracks changes to CLKIN. The frequency stability of the output clock, CLKOUT, is determined by the frequency stability of DCO 308, which is based on the frequency-stable clock signal being locked to a low-jitter clock signal by PLL 301 and PLL 303.

Referring to FIG. 4, feedback frequency divider 310 supplies the frequency-divided signal to phase detector 302. Phase detector 302 also receives as the input signal CLKIN to which PLL 305 is designed to lock. Phase detector 302 supplies a phase error signal reflecting the difference between the CLKIN signal and the feedback signal to loop filter 304, which in an embodiment is an all digital loop filter. Loop filter 304 may be configured as a low pass filter. A filtered phase error signal is used to generate control signal(s) for DCO 308 of FIG. 4. Note that initial control signals may be provided to PLL 305 from a storage element (e.g., volatile or non-volatile memory). Those initial control signals may be selected according to, e.g., the target output frequency of CLKOUT, the frequency of CLKIN, and the frequency of CLK1.

Figure 5:
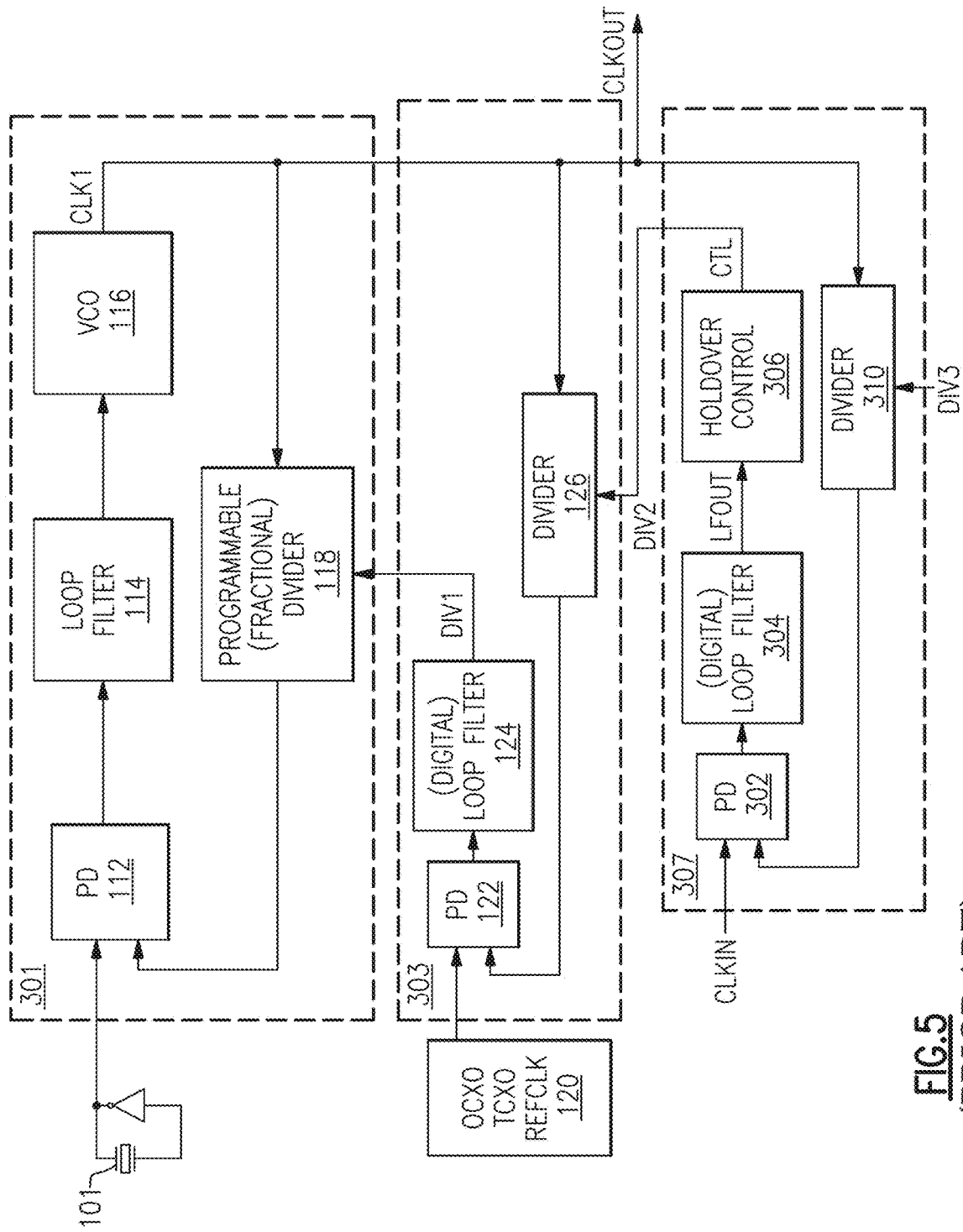
FIG. 5 illustrates a functional block diagram of a cascaded PLL clock generation circuit consistent.

FIG. 5 illustrates a functional block diagram of a nested PLL clock generation circuit consistent.

Referring to FIG. 5, in at least one other embodiment of a clock generator, an outer loop 307 is included instead of outer loop PLL 305. Outer loop PLL 307 excludes the DCO altogether and provides the control signal output as the divider value for feedback frequency divider 126 of PLL 303. The clock generator provides CLK1 as the output clock signal or provides CLK1 to another frequency divider that generates the output clock signal (not shown). However, to generate multiple output clock signals CLKOUT1, CLKOUT2, CLKOUT3, and CLKOUT4 based on multiple corresponding input clock signals CLKIN1, CLKIN2, CLKIN3, and CLKIN4, respectively, and multiple corresponding divider values DIV3-1, DIV3-2, DIV3-3, and DIV3-4, respectively, using outer loop PLL 307 of FIG. 5, the clock generator also includes multiple DCOs 308 (e.g., corresponding interpolative dividers and associated digital logic configured as DCOs 308) to generate the multiple corresponding output clock signals based on CLK1 and the multiple corresponding control signal outputs CTL1, CTL2, CTL3, and CTL4, respectively, of outer loop PLLs 307.

In FIG. 5, although CLK 1 is demonstrated to be identical to CLKOUT, it may not be always the case. For example, if there are four PLLs, each of which has the output referred to CLK1, CLK2, CLK3 and CLK4, respectively, each of the outputs may be scaled to generate the total output CLKOUT. The number of nested PLLs is not limited thereto.

In a PLL system, before a PLL loop is closed, it is useful to calculate the expected output clock frequency so that the output clock signal can be ramped to that frequency or jumped to that frequency before closing the loop. This allows the output clock frequency change in a smooth and controlled manner or achieve instant frequency lock.

To calculate the target frequency, the input clock frequency needs to be measured with an available and accurate on chip clock source. A good source for the input clock frequency may be a divided down version of the Voltage Controlled Oscillator (VCO) clock. That is, the input clock frequency may be an output clock signal generated by the VCO that is fed and input to the PLL loop. However, VCO frequency needs to be controlled by a PLL loop, and in many cases, it can be controlled by nested multiple PLL loops.

We need to wait for the VCO frequency settled, pulled by all inner loops, before doing the measurement for an outer loop's input clock frequency. For measuring the frequency of an input clock of a PLL loop outside the VCO loop, all PLL loops that control the VCO frequency need to be settled. This wait time can be long due to two facts: 1) for low bandwidth PLL loops; and 2) the need to make sure the VCO frequency is really settled to achieve accurate input clock frequency measurement. Also, as each nested PLL loop for the VCO loops, from the inner most loop to the outer most loop, the settled VCO frequency at each loop locked stage carries unfiltered portion of all inner loops' input clock noise. This noise affects the accuracy of the calculated output clock target frequency.

Therefore, it is desirable to remove the need to wait for the VCO to settle before measuring the input clock frequency. This will significantly reduce the PLL system's start up time, especially for a nested VCO loop structure. In addition, it is also desired to avoid the error caused by unstable up stream loop input clocks.

According to the conventional manner, the input clock frequency is measured with a settled available and accurate on chip clock source, like a divided down VCO clock. Then the output clock target frequency is calculated with appropriate equations based on each PLL loop structure.

To address this technical problem, a clock signal generator with improved accuracy of target frequency in multi-loop PLL system according to an embodiment of the present disclosure is provided.

According to the embodiments of the present disclosure, after the first PLL is closed, instead of measuring the input clock frequency of a second PLL alone, a reference clock frequency is also measured. This reference clock can be referred to as 'OOF_refclk'. Examples of OOF_refclk could be a XO input or a VCXO input to the device, or any of the input clocks to the device. The OOF_refclk should be a stable frequency source. The input clock frequency is measured similarly to previous solutions, and at the same time interval the OOF_refclk frequency is also measured. Then, a relative value of the input clock frequency with respect to the OOF_refclk frequency is defined. Since both clock frequencies are measured at the same time interval, so long as the two clocks are frequency stable over the measurement interval, to the first order, the ratio is independent of VCO frequency value or of VCO frequency time vary profile.

Since the above described frequency ratio for customer readable information is already needed, this embodiment of the present disclosure does not increase HW size. However, for customer readable information, since the accuracy requirement is not as stringent, it is sufficient to measure the OOF_refclk frequency with its own measurement interval and the measured value is shared across all input clocks for their frequency ratio calculations. According to the embodiment of the present disclosure, the OOF_refclk frequency measurement is duplicated for each input clock to apply the same measurement interval used for the particular input clock. Of course, this HW addition also makes customer readable information more precise and the information is available even when the VCO frequency is not settled.

Figure 6:
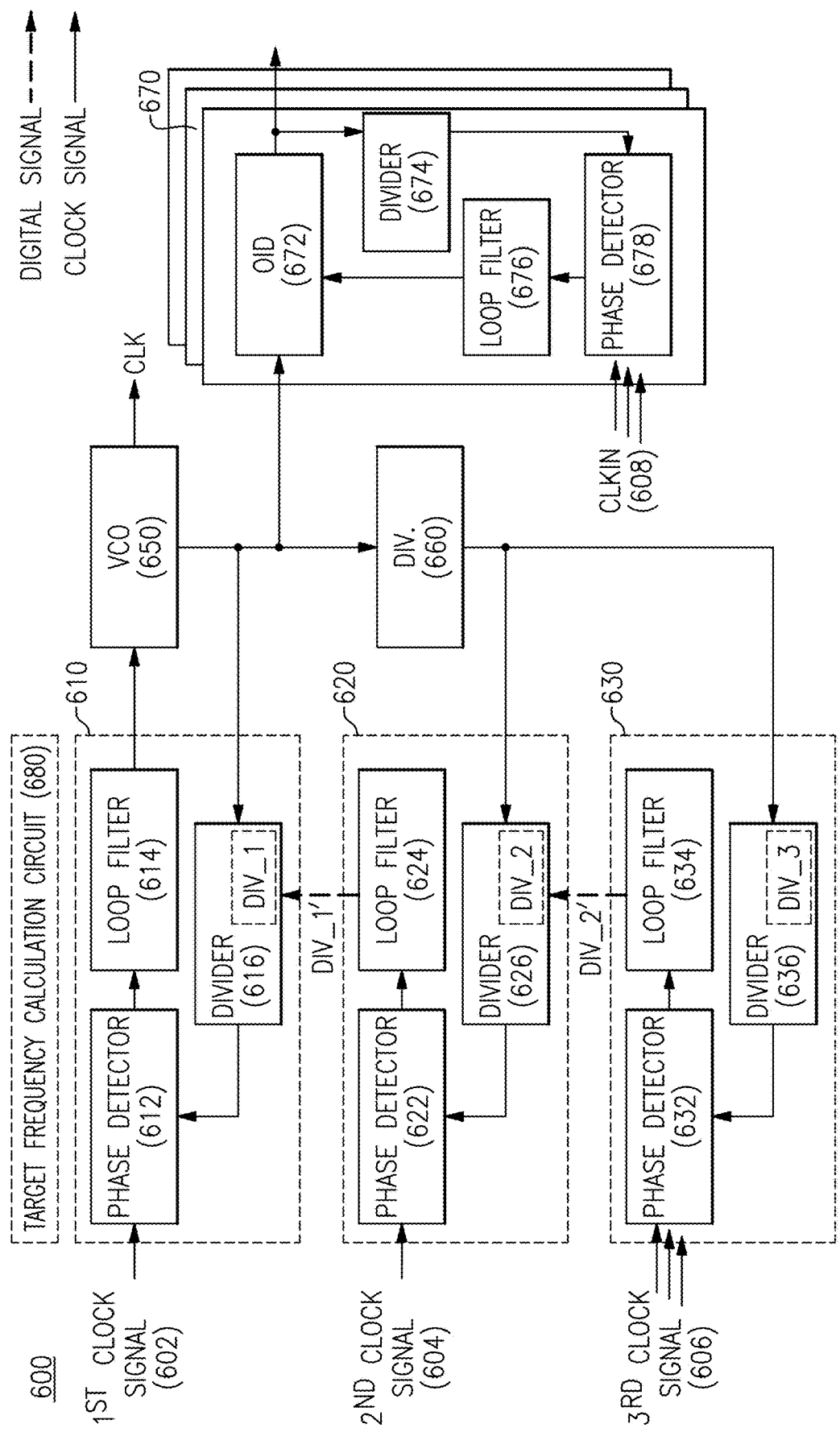
FIG. 6 illustrates a schematic diagram of a multi-loop clock signal generator according to an embodiment of the present disclosure.

FIG. 6 illustrates a schematic diagram of a multi-loop clock signal generator 600 according to an embodiment of the present disclosure.

The multi-loop clock signal generator 600 includes a first phase locked loop (PLL) circuit 610, a second PLL circuit 620, and voltage controlled oscillator 650. According to an embodiment, the multi-loop clock signal generator 600 may further include a target frequency calculation circuit 680.

The first PLL circuit 610 is configured to generate a control signal based on a first clock signal 602 and a first divider value (Div_1). The first clock signal 602 may be, for example, an XO input signal. According to an embodiment, the first PLL circuit 610 may include a phase detector 612, a loop filter 614, and a divider 616. The phase detector may be configured to detect phase or frequency difference between the first clock signal 602 and feedback signal provided by the divider 616. The feedback signal may be divided down signal of the output clock frequency which is generated by the VCO 650. The loop filter 614 is configured to filter out unnecessary signal. The divider 616 may be configured to generate the feedback signal based on the first divide value.

The VCO 650 is configured to generate an output clock signal based on the control signal provided by the first PLL circuit 610. The first PLL circuit 610 may be configured to provide the generated control signal to the VCO 650 to generate output signal. Since the output signal of the VCO depends on the voltage value, the control signal may be generated to control the voltage value applied to the VCO 650.

The second PLL circuit 620 is configured to adjust the first divider value (Div_1) of the first PLL circuit 610 according to a target frequency of the second PLL circuit 620 for the output clock signal based on a second clock signal 604 and a second divider value (Div_2). The target frequency of second PLL circuit 620 for the output clock signal may be calculated by a target frequency calculation circuit 680. However, it is also possible that the target frequency is calculated by any processor disposed inside the second PLL circuit 620. The target frequency of the second PLL circuit 620 may be a final target frequency of VCO 650, when the multi-loop clock signal generator 600 includes 2 PLL loops, e.g. the first PLL circuit 610 and the second PLL circuit 620. In case the multi-loop clock signal generator 600 includes more than 3 PLL loops, the target frequency of the second PLL circuit 620 may be construed as an intermediate target frequency of VCO 650. Thus, the target frequency may be a final target frequency or an intermediate target frequency only for the second PLL circuit 620 depending on the configuration of the multi-loop clock signal generator 600.

According to an embodiment, the second PLL circuit 620 may include a phase detector 622, a loop filter 624, and a divider 626. The phase detector 622 may be configured to detect the phase or frequency difference between the second clock signal 604 and the feedback signal generated by the divider 626. The feedback signal may be divided down signal of the output clock signal generated by the VCO 650. According to an embodiment, the output clock signal of the VCO 650 may be divided down by external divider 660 in advance. The loop filter 624 may be configured to generate an adjusted first divider value (Div_1') for the first PLL circuit 610. The adjusted first divider may include a scaling factor of the first input clock signal. The loop filter 624 may be provide the adjusted divider value (Div_1') to the first PLL circuit 610, and the first PLL circuit 610 may be configured to replace the previous first divide value (Div_1) with the adjusted divide value (Div_1'). As a result, the output clock signal generated by VCO 650 may be also adjusted accordingly.

The target frequency of the second PLL circuit 620 may be calculated based on a target frequency ratio of the second PLL circuit 620. The target frequency ratio of the second PLL circuit 620 may be used to change the divider value of the first PLL circuit 610, e.g. first divider value (Div_1). The calculation of the target frequency of the second PLL circuit 620 may be described below with Equation 4. The target frequency ratio may be independent from a variation of the output signal generated by VCO 650. Thus, the target frequency for the second PLL circuit 620 may be calculated even when the VCO frequency is still settling in response to the control signal applied to the VCO 650. Hereinafter, it is described how to calculate the target frequency of the second PLL circuit 620.

The first clock signal 602 and the reference clock (OOF_refclk) signal frequencies can be measured at a same interval of time. The reference clock signal may be a chosen input signal, e.g. XO, Refclk or one of CLKIN. For the sake of convenience, the interval of time on which the first clock signal 602 and the OOF_refclk may be referred to a first time interval. After that, a frequency offset ratio of the first clock signal 602 may be calculated. The frequency offset ratio of the first clock signal 602 may be defined with respect to the OOF_refclk. The frequency offset ratio of the first clock signal 602 may be defined in the equation 1. Frequency offset ratio is independent of VCO frequency time vary profile since (measured first input clock signal) and (measured OOF_refclk) are measured at the same time interval.

$$\text{Frequency offset ratio} = 1 - \frac{(\text{measured first input clock signal}) \times (\text{scaling value})}{(\text{measured OOF\_refclk})}.$$ [Equation 1]

The scaling value in Equation 1 may be a user-defined value. Although the first input clock signal 602 is not affected by the output signal theoretically, particularly when the VCO 650 is not yet stable, the measured value of the first clock signal 602 may be varied. The measured first input clock signal and the measured OOF_refclk may be measured at a same time interval, and therefore the frequency offset ratio is independent from the VCO frequency time vary profile. Even when the target frequency ratio happens to be always calculated from two frequency offset ratios, since each frequency offset ratio is already independent of VCO frequency time vary profile, target frequency ratio and the target frequency may also be independent from a variation of the output signal generated by the VCO 650.

The second clock signal 604 and the OOF_refclk signal frequencies can be measured at a same interval of time, as well. For the sake of convenience, the interval of time on which the second clock signal 604 and the OOF_refclk may be referred to a second time interval. The first time interval and the second time interval may be different from each other. The second time interval may be after the first PLL circuit 610 is closed. After that, a frequency offset ratio of the second clock signal 604 may be calculated. The frequency offset ratio of the second clock signal 604 may be defined with respect to the OOF_refclk. The frequency offset ratio of the second clock signal 604 may be defined in the equation 2. Frequency offset ratio is independent of VCO frequency time vary profile since (measured second input clock signal) and (measured OOF_refclk) are measured at the same time interval.

$$\text{Frequency offset ratio} = 1 - \frac{(\text{measured second input clock signal}) \times (\text{scaling value})}{(\text{measured OOF\_refclk})}. \quad [\text{Equation 2}]$$

The scaling value in Equation 2 may be a user-defined value. Although the second input clock signal 604 is not affected by the output signal theoretically, particularly when the VCO 650 is not yet stable, the measured value of the second clock signal 604 may be varied.

The frequency target ratio may be calculated based on the frequency offset ratio of the first clock signal 602, and the frequency offset ratio of the second clock signal 604. Each of the frequency offset ratios of the first clock signal 602 and the second clock signal 604 may be independent on the output signal generated by the VCO 650. Therefore, the frequency target ratio may be also independent on the output signal generated by the VCO 650.

The target frequency ratio of the first clock signal 602 to the second clock signal 604 may be calculated as defined by equation 3.

$$\text{Target frequency ratio} = \frac{(\text{Div\_1})}{(\text{Div\_1}')} \times \frac{(\text{Div\_2}')}{(\text{Div\_2})} \times \frac{(1 - \text{frequency offset ratio\_first clock signal})}{(1 - \text{frequency offset ratio\_second clock signal})}, \quad [\text{Equation 3}]$$

wherein, Div_1 is the first divider value, Div_1' is the adjusted first divider value, Div_2 is the second divider value, Div_2' is an adjusted second divider value, if exists (if not, equals to Div_2), frequency offset ratio_first clock signal is frequency offset ratio for the first clock signal at a first interval of time, frequency offset ratio_second clock signal is frequency offset ratio for the second clock signal at a second interval of time. The first interval of time and the second interval of time may be identical to each other, but may also be different from each other.

The target frequency of the second PLL circuit 620 may be calculated using equation 4.

$$\text{Target frequency} = (\text{Target frequency ratio} - 1) \times \text{adjusted first divide value}. \quad [\text{Equation 4}]$$

In this manner, the second PLL circuit 620 according to an embodiment of the present disclosure may obtain the target frequency which is independent from the frequency of the VCO profile.

Each of the first clock signal 602 and the second clock signal 604 may be generated by at least one of crystal oscillator (XO), temperature compensated crystal oscillator (TCXO) and oven controlled crystal oscillator (OCXO).

According to an embodiment, the multi-loop clock signal generator 600 may further include a third PLL circuit 630. The third PLL circuit 630 may be configured to adjust the second divider value (Div_2) of the second PLL circuit 620 according to a target frequency of the third PLL circuit based on at least one third clock signal 606 and a third divider value (Div_3). In an example, the third PLL circuit 630 may be configured to receive a plurality of clock signals 606.

According to an embodiment, the target frequency of the third PLL circuit 630 may be calculated in a same manner of the calculation of the target frequency of the second PLL circuit 620. Thus, it is understood that the detailed description about calculation of the target frequency for the second PLL circuit 620 can be applied to the third PLL circuit 630. According to an embodiment, there is not limitation on the number of PLL loops included in the multi-loop clock signal generator 600, and the subsequent PLL circuits may be configured identically to the second PLL circuit 620.

According to an embodiment, the time required to calculate each of the target frequencies can be reduced because the calculation can be initiated as soon as the previous loop is activated (even when the loop is still not yet settled), while enhancing the accuracy of calculation of the target frequency. Nevertheless, the sequence of activating each PLL loops should be followed as set in advance.

According to an embodiment, the multi-loop clock signal generator 600 may further includes at least one OIDPLL circuit 670 that uses output interpolative divider (OID) circuit 672. The OIDPLL circuit 670 may include an OID block 672, dividers 674 and 676, and a phase detector 678.

Figure 7:
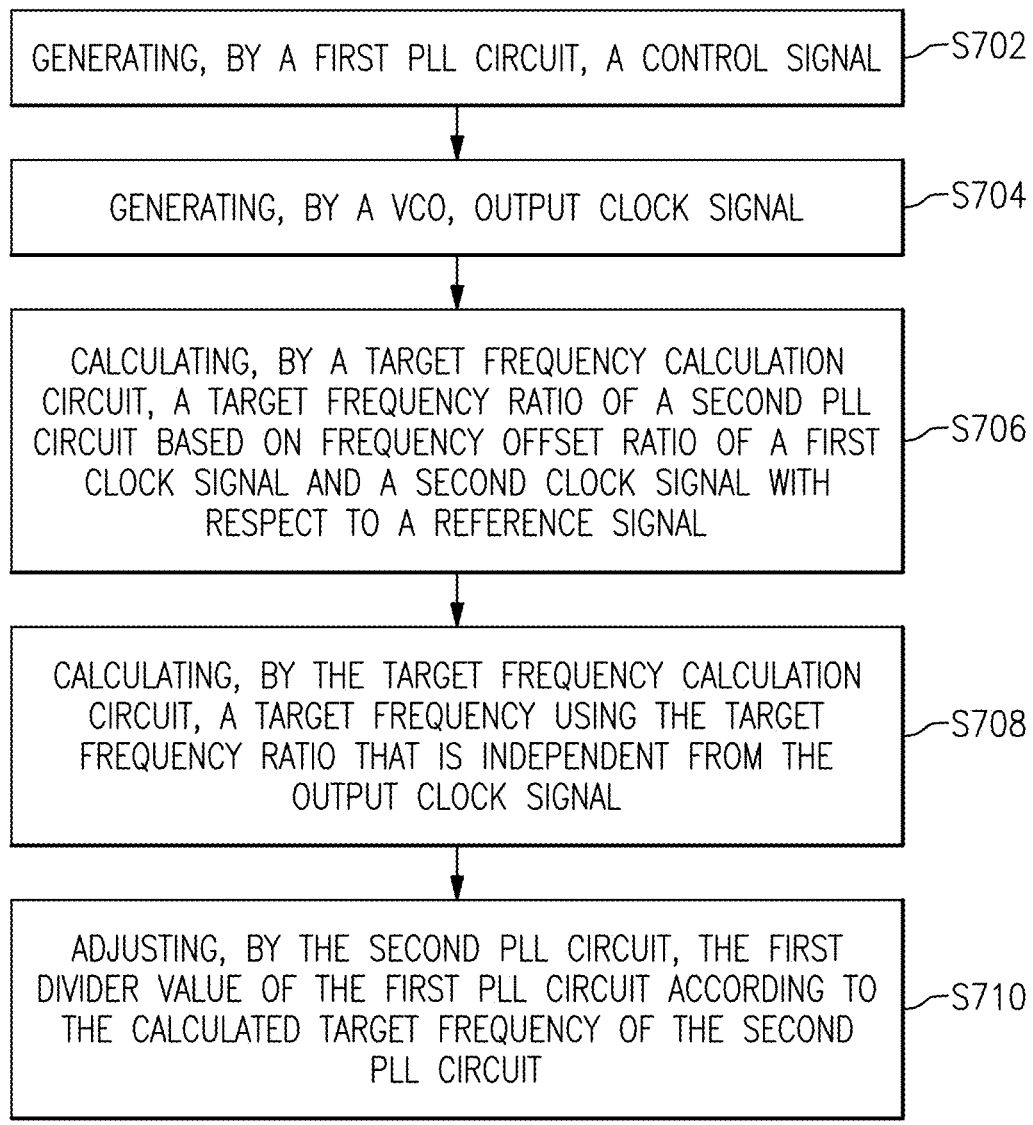
FIG. 7 illustrates a flow chart of a method for generating an output clock signal according to an embodiment of the present disclosure.

FIG. 7 illustrates a flow chart of a method for generating an output clock signal according to an embodiment of the present disclosure. The method shown in FIG. 7 may be performed using a multi-loop clock signal generator shown in FIG. 6.

In step S702, the first PLL circuit may generate a control signal based on a first clock signal and a first divider value.

In step S704, the VCO may generate an output clock signal based on the control signal provided by the first PLL circuit.

In step S706, the target frequency calculation circuit 680 may calculate a target frequency ratio based on a frequency offset ratio of the first clock signal with respect to a reference signal measured at a first time interval and a frequency offset ratio of a second clock signal with respect to the reference signal measured at a second time interval after the first PLL circuit is closed. Both frequency offset ratios are independent from the output clock signal generated by the VCO 650.

In step S708, the target frequency calculation circuit 680 may calculate a target frequency for a second PLL circuit based on the target frequency ratio of the second PLL circuit 620.

In step S710, the second PLL may generate an adjusted first divider value according to the calculated target frequency based on the second clock signal and a second divider value.

The detailed features of the first PLL circuit, the second PLL circuit, and the VCO are described above referring to FIG. 6.

Figure 8A:
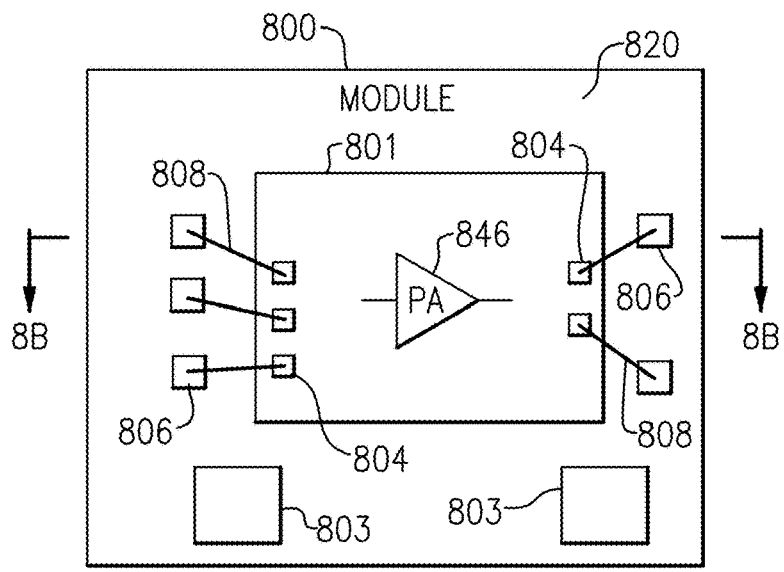
FIG. 8A is a schematic diagram of one embodiment of a packaged module.
Figure 8B:
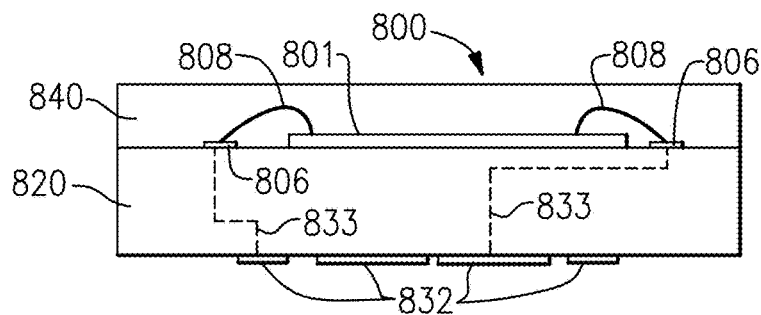
FIG. 8B is a schematic diagram of a cross-section of the packaged module of FIG. 8A taken along the lines 8B-8B.

FIG. 8A is a schematic diagram of one embodiment of a packaged module 800. FIG. 8B is a schematic diagram of a cross-section of the packaged module 800 of FIG. 8A taken along the lines 8B-8B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 820.

The die 801 includes a power amplifier system 846, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 8B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 8B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 9:
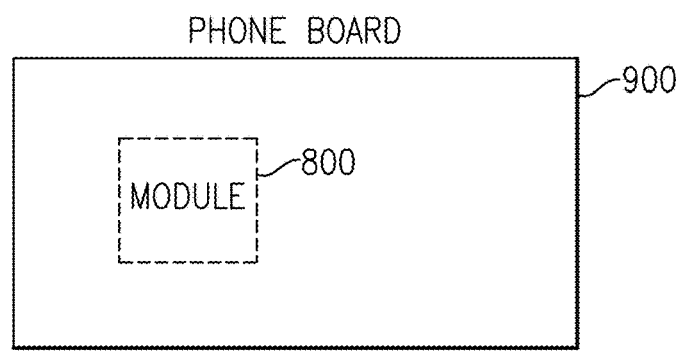
FIG. 9 is a schematic diagram of one embodiment of a phone board.

FIG. 9 is a schematic diagram of one embodiment of a phone board 900. The phone board 900 includes the module 800 shown in FIGS. 8A-8B attached thereto. Although not illustrated in FIG. 9 for clarity, the phone board 900 can include additional components and structures.

Figure 10:
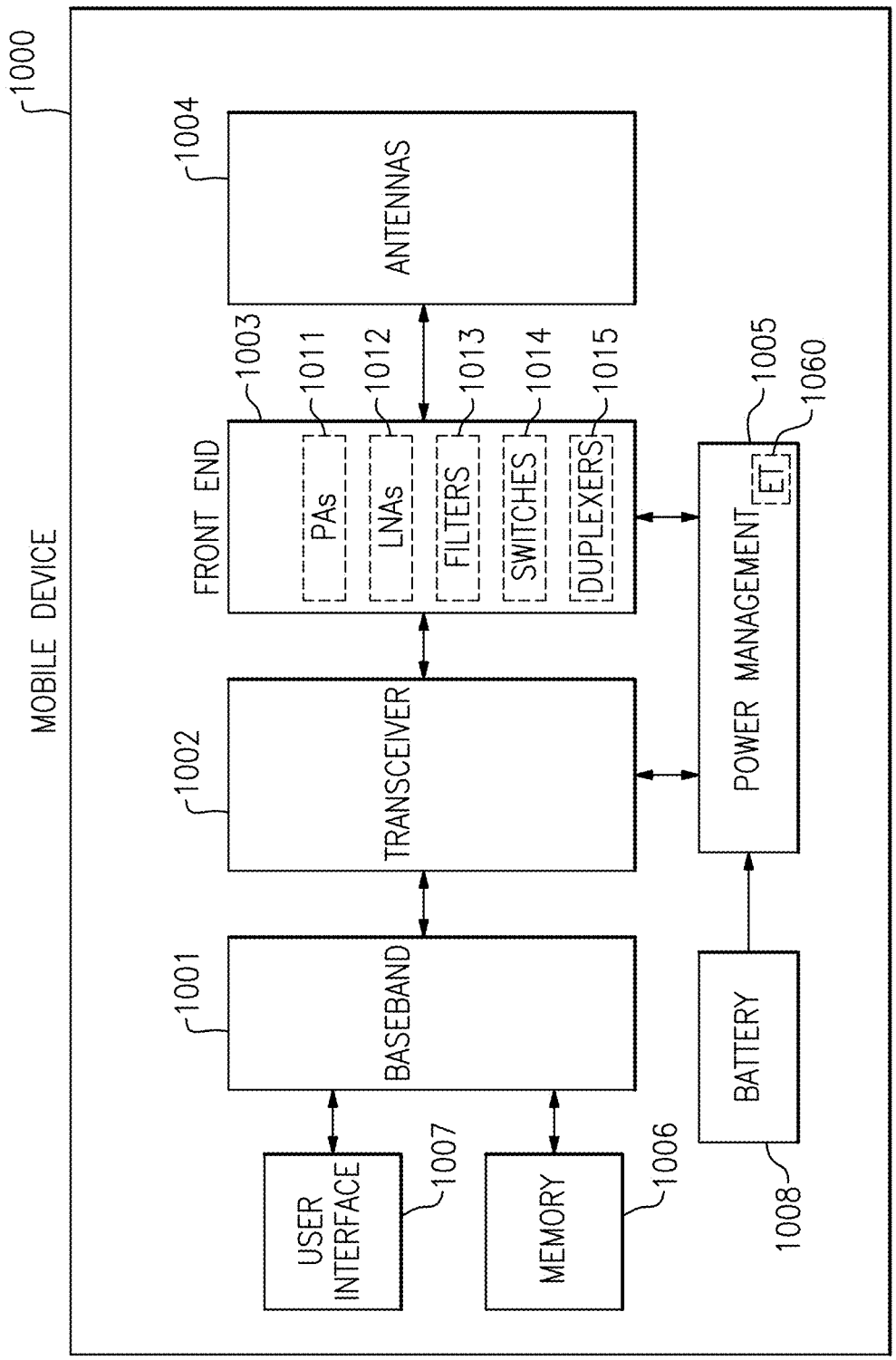
FIG. 10 is a schematic diagram of one embodiment of a mobile device.

FIG. 10 is a schematic diagram of one example of a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 10 as the transceiver 1002. In one example, separate components (for instance, separate circuits or dies) can be provided for handling certain types of RF signals.

The front end system 1003 aids in conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. However, other implementations are possible.

For example, the front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas associated transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 10, the baseband system 1001 is coupled to the memory 1006 of facilitate operation of the mobile device 1000. For example, the baseband system 1001 may include clock generation circuits according to embodiments disclosed herein.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 10 includes an envelope tracker 1060. As shown in FIG. 10, the power management system 1005 receives a battery voltage form the battery 1008. The battery 1008 can be any suitable battery for use in the mobile device 1000, including, for example, a lithium-ion battery.

The mobile device 1000 of FIG. 10 illustrates one example of an RF communication system that can include clock generation circuits implemented in accordance with one or more features of the present disclosure. However, the teachings herein are applicable to RF communication systems implemented in a wide variety of ways.

APPLICATIONS

Some of the embodiments described above have provided examples in connection with wireless devices or mobile phones. However, the principles and advantages of the embodiments can be used for any other systems or apparatus that have needs for power amplifiers.

Such clock generator integrated circuits and/or signal generators can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multi-loop clock signal generator comprising:
  a first phase-locked loop circuit configured to generate a control signal based on a first clock signal and a first divider value;
  a voltage-controlled oscillator configured to generate an output clock signal based on the control signal provided by the first phase-locked loop circuit;
  a second phase-locked loop circuit configured to generate an adjusted first divider value for the first phase-locked loop circuit according to a target frequency of the second phase-locked loop circuit based on a second clock signal and a second divider value; and
  a target frequency calculation circuit configured to calculate the target frequency for the second phase-locked loop circuit based on a target frequency ratio that is independent from the output clock signal generated by the voltage-controlled oscillator and that is calculated based on a frequency offset ratio of the first clock signal with respect to a reference signal measured at a first time interval and a frequency offset ratio of the second clock signal with respect to the reference signal measured at a second time interval after the first phase-locked loop circuit is closed.

2. The multi-loop clock signal generator of claim 1 wherein calculation of the target frequency is performed while the output clock signal of the voltage-controlled oscillator is still settling, after the first phase-locked loop circuit is closed.

3. The multi-loop clock signal generator of claim 1 wherein each of the first clock signal and the second clock signal is generated by at least one of crystal oscillator (XO), temperature compensated crystal oscillator (TCXO) and oven controlled crystal oscillator (OCXO).

4. The multi-loop clock signal generator of claim 1 wherein calculation of the target frequency includes scaling the second clock signal in frequency based on a scaling value.

5. The multi-loop clock signal generator of claim 4 wherein the frequency offset ratio for the second clock signal is calculated based on the second clock signal, the scaling value, and a reference clock.

6. The multi-loop clock signal generator of claim 5 wherein the target frequency ratio is calculated by taking a product of: 1) the first divider value divided by the adjusted first divider value, 2) the second divider value divided by an adjusted second divider value, the frequency offset ratio for the first clock signal divided by the frequency offset ratio for the second clock signal.

7. The multi-loop clock signal generator of claim 5 wherein the target frequency is defined by: Target frequency=(target frequency ratio−1)*the adjusted first divider value.

8. The multi-loop clock signal generator of claim 1 further comprising:
  a third phase-locked loop circuit configured to generate an adjusted second divider value according to a target frequency of the third phase-locked loop circuit based on at least one third clock signal and a third divider value, the target frequency calculation circuit being configured to calculate a target frequency for the third phase-locked loop circuit based on a target frequency ratio of the third phase-locked loop circuit that is independent from the output clock signal generated by the voltage-controlled oscillator, the target frequency ratio calculated based on a frequency offset ratio of the second clock signal with respect to the reference signal measured at second time interval and a frequency offset ratio of the at least one third clock signal with respect to the reference signal measured at a third time interval after the second phase-locked loop circuit is closed.

9. The multi-loop clock signal generator of claim 8 wherein calculation of the target frequency of the third phase-locked loop circuit is performed while the output clock signal of the voltage-controlled oscillator is settling, after the second phase-locked loop circuit is closed.

10. A method for generating an output clock signal using multi-loop clock signal generator, the method comprising:
  generating, by a first phase-locked loop circuit, a control signal based on a first clock signal and a first divider value;
  generating, by a voltage-controlled oscillator, an output clock signal based on the control signal;
  calculating, by a target frequency calculation circuit, a target frequency ratio of a second phase-locked loop circuit based on a frequency offset ratio of the first clock signal with respect to a reference signal measured at a first time interval and a frequency offset ratio of a second clock signal with respect to the reference signal measured at a second time interval after the first phase-locked loop circuit is closed;
  calculating, by the target frequency calculation circuit, a target frequency based on the target frequency ratio, the target frequency independent from the output clock signal generated by the voltage-controlled oscillator; and
  generating, by the second phase-locked loop circuit, an adjusted first divider value for the first phase-locked loop circuit according to the target frequency based on the second clock signal and a second divider value.

11. The method of claim 10 wherein calculating the target frequency is performed while the output clock signal of the voltage-controlled oscillator is still settling.

12. The method of claim 10 wherein each of the first clock signal and the second clock signal is generated by at least one of crystal oscillator (XO), temperature compensated crystal oscillator (TCXO) and oven controlled crystal oscillator (OCXO).

13. The method of claim 10 wherein calculating the target frequency includes scaling the second clock signal in frequency based on a scaling value.

14. The method of claim 13 wherein the frequency offset ratio for the second clock signal is calculated using the second clock signal, the scaling value, and a reference clock.

15. The method of claim 14 wherein the target frequency ratio is calculated based on the target frequency ratio is calculated by taking a product of: 1) the first divider value divided by the adjusted first divider value, 2) the second divider value divided by an adjusted second divider value, the frequency offset ratio for the first clock signal divided by the frequency offset ratio for the second clock signal.

16. The method of claim 14 wherein the target frequency is defined by:
target frequency=(target frequency ratio−1)*Div_1', wherein Div_1' is the adjusted first divider value.

17. The method of claim 10 further comprising:
calculating, by the target frequency calculation circuit, a target frequency ratio based on a frequency offset ratio of the second clock signal with respect to a reference signal measured at the second time interval and a frequency offset ratio of a third clock signal with respect to the reference signal measured at a third time interval after the second phase-locked loop circuit is closed;
calculating, by the target frequency calculation circuit, a target frequency for a third phase-locked loop circuit based on the target frequency ratio of the third phase-locked loop circuit that is independent from the output clock signal generated by the voltage-controlled oscillator; and
generating, by the third phase-locked loop circuit, an adjusted second divider value for the second phase-locked loop circuit according to the target frequency of the third phase-locked loop circuit based on the third clock signal and a third divider value.

18. The method of claim 17 wherein calculation of the target frequency of the third phase-locked loop circuit is performed while the output clock signal of the voltage-controlled oscillator is settling, after the second phase-locked loop circuit is closed.

\* \* \* \* \*